United States Patent
Doherty et al.

(10) Patent No.: US 8,692,161 B2
(45) Date of Patent: Apr. 8, 2014

(54) FURNACE SYSTEM WITH CASE INTEGRATED COOLING SYSTEM

(75) Inventors: Timothy R Doherty, Woburn, MA (US); Derek J Butland, Lowell, MA (US)

(73) Assignee: BTU International, Inc., North Billerica, MA (US)

(*) Notice: Subject to any disclaimer, the term of this patent is extended or adjusted under 35 U.S.C. 154(b) by 334 days.

(21) Appl. No.: 13/192,701

(22) Filed: Jul. 28, 2011

(65) Prior Publication Data

US 2013/0026155 A1  Jan. 31, 2013

(51) Int. Cl.
*F27B 9/06* (2006.01)
*F26B 19/00* (2006.01)

(52) U.S. Cl.
USPC ........... 219/388; 219/390; 219/405; 219/411; 219/395; 219/420; 392/416; 392/415; 392/410; 392/420

(58) Field of Classification Search
USPC ................ 219/390, 405, 411, 395, 420, 388; 392/416, 418, 410, 420
See application file for complete search history.

(56) References Cited

U.S. PATENT DOCUMENTS

| | | | |
|---|---|---|---|
| 7,514,650 B2 | 4/2009 | Melgaard et al. | |
| 7,805,064 B2 * | 9/2010 | Ragay et al. | 392/416 |
| 8,039,289 B2 | 10/2011 | Parks et al. | |
| 2001/0023055 A1 | 9/2001 | Sakamoto et al. | |
| 2010/0220983 A1 | 9/2010 | Doherty et al. | |
| 2010/0267188 A1 | 10/2010 | Parks et al. | |
| 2011/0013892 A1 | 1/2011 | Ragay et al. | |

* cited by examiner

*Primary Examiner* — Shawntina Fuqua
(74) *Attorney, Agent, or Firm* — Preti Flaherty Beliveau & Pachios LLP

(57) ABSTRACT

An infrared firing furnace includes a case-integrated cooling system to provide high performance cooling as the first step in the cooling process. The cooling system includes a cooling manifold integrated into, and made from, the same case material as the adjacent firing zone. As the cooling system is made from the same material as the rest of the case, it can handle being exposed to higher temperatures. The cooling system is positioned such that the plane of its outlet is at a specific clearance level relative to the product passing underneath. High pressure cooling jets of air are directed downward toward the products as they pass under the cooling manifold in order to quickly bring the temperature of the products down from the much higher firing temperature, and minimize the dwell time of the product at the higher temperature.

12 Claims, 5 Drawing Sheets

FURNACE SYSTEM WITH CASE INTEGRATED COOLING SYSTEM

RELATED APPLICATIONS

N/A

BACKGROUND OF THE INVENTION

Solar or photovoltaic cells are manufactured by depositing conductive inks in desired patterns on the tops and bottoms of a solar cell wafer. The wafers are thermally processed in a furnace system to dry the conductive ink and burn off binders and other materials after which the materials are fired to form metallization patterns on the wafer surfaces. Furnace systems for such metallization processes typically employ infrared heating lamps to provide the rapid thermal processing environment needed for processing the wafers.

Known wafer firing furnaces can be generally characterized as comprising three sections: a drying zone at an entrance where the wafers are loaded into the furnace; a burnout/firing zone, generally thought of as the middle zone; and a cooling section located at the end and having an exit from which the wafers are removed. In some wafer firing furnaces, a single-belt conveyor is used to move the wafers through the sections and, therefore, the wafers move through each section at the same speed. Alternatively, multi-belt structures are known where a separate belt runs through each section, allowing for variations in belt speed depending upon the section.

It is known that the wafer should be quickly cooled after it has reached its maximum temperature in order to assure highest quality wafers. Known ovens, however, cause a heated wafer to dwell at this high temperature because of the time necessary to transfer the wafer from the burnout/firing zone to the cooling zone.

What is needed is a wafer processing furnace that provides for minimal dwell time at temperature along with a very fast cooling profile.

BRIEF SUMMARY OF THE INVENTION

An infrared firing furnace includes a case-integrated cooling system to provide high performance cooling as the first step in the cooling process. The cooling system includes a cooling manifold integrated into, and made from, the same case material as the adjacent firing zone. As the cooling system is made from the same material as the rest of the case, it can handle being exposed to higher temperatures. The cooling system is positioned such that the plane of its outlet is at a specific clearance level relative to the product passing underneath. High pressure cooling jets of air are directed downward toward the products as they pass under the cooling manifold in order to quickly bring the temperature of the products down from the much higher firing temperature, and minimize the dwell time of the product at the higher temperature.

BRIEF DESCRIPTION OF THE SEVERAL VIEWS OF THE DRAWINGS

Embodiments of the present invention may be better understood by referring to the following description in conjunction with the accompanying drawings in which.

Figure 1:
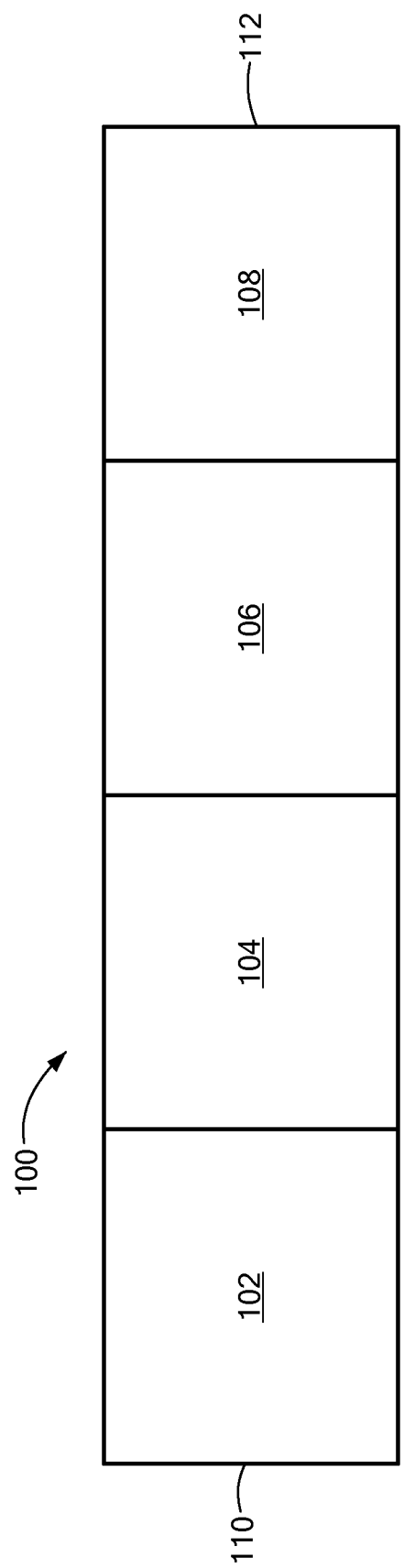
FIG. 1 is a block diagram of an infrared furnace in accordance with an embodiment of the present invention.

It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. Moreover, some of the blocks depicted in the drawings may be combined into a single function.

DETAILED DESCRIPTION OF THE INVENTION

In the following detailed description, numerous specific details are set forth in order to provide a thorough understanding of the various embodiments of the present invention. It will be understood by those of ordinary skill in the art that embodiments of the present invention may be practiced without some of these specific details. In other instances, well-known methods, procedures, components and structures may not have been described in detail so as not to obscure details of the embodiments of the present invention.

In accordance with various embodiments of the present invention, a furnace is provided with a case-integrated cooling system to provide high performance cooling as the first step in the cooling process. The cooling system includes a cooling manifold integrated into, and made from, the same case material as the firing zone, and located adjacent to the firing zone. As the cooling manifold is made from the same material as the rest of the case, it can handle being exposed to higher temperatures. The cooling manifold is positioned such that the plane of its outlet is at a specified clearance level relative to the product passing underneath. High pressure cooling jets of air are directed downward toward the products as they pass under the cooling manifold in order to quickly bring the temperature of the products down from the firing temperature, and thereby minimize the dwell time of the product at the higher temperature. The case may be made of insulator brick or other known insulating material.

Referring now to FIG. 1, an infrared furnace system 100 in accordance with one embodiment of the present invention includes a drying section 102, a burnout/firing section 104 and cooling section 106 arranged, generally as is known, one after the other in series. A high performance convection (HPC) cooler section 108 is located after the cooling section 106.

In operation, a workpiece such as, e.g., a wafer or other object or product to be processed, is placed into an opening 110 at the start of the drying section 102 and moved along, for example, by a conveyor belt or the like, from one section to the next. A wafer, for example, is exposed to varying gases and temperatures depending on the process, technology and type of wafer as is generally known. The specifics of the processing of a wafer, however, are not necessary to the operation, or description, of the embodiments of the present invention as will be described in more detail below. The wafer passes from the section 106 into the HPC cooler section 108 and then the processed wafer exits from the HPC cooler section 108 at an opening 112.

Figure 2:
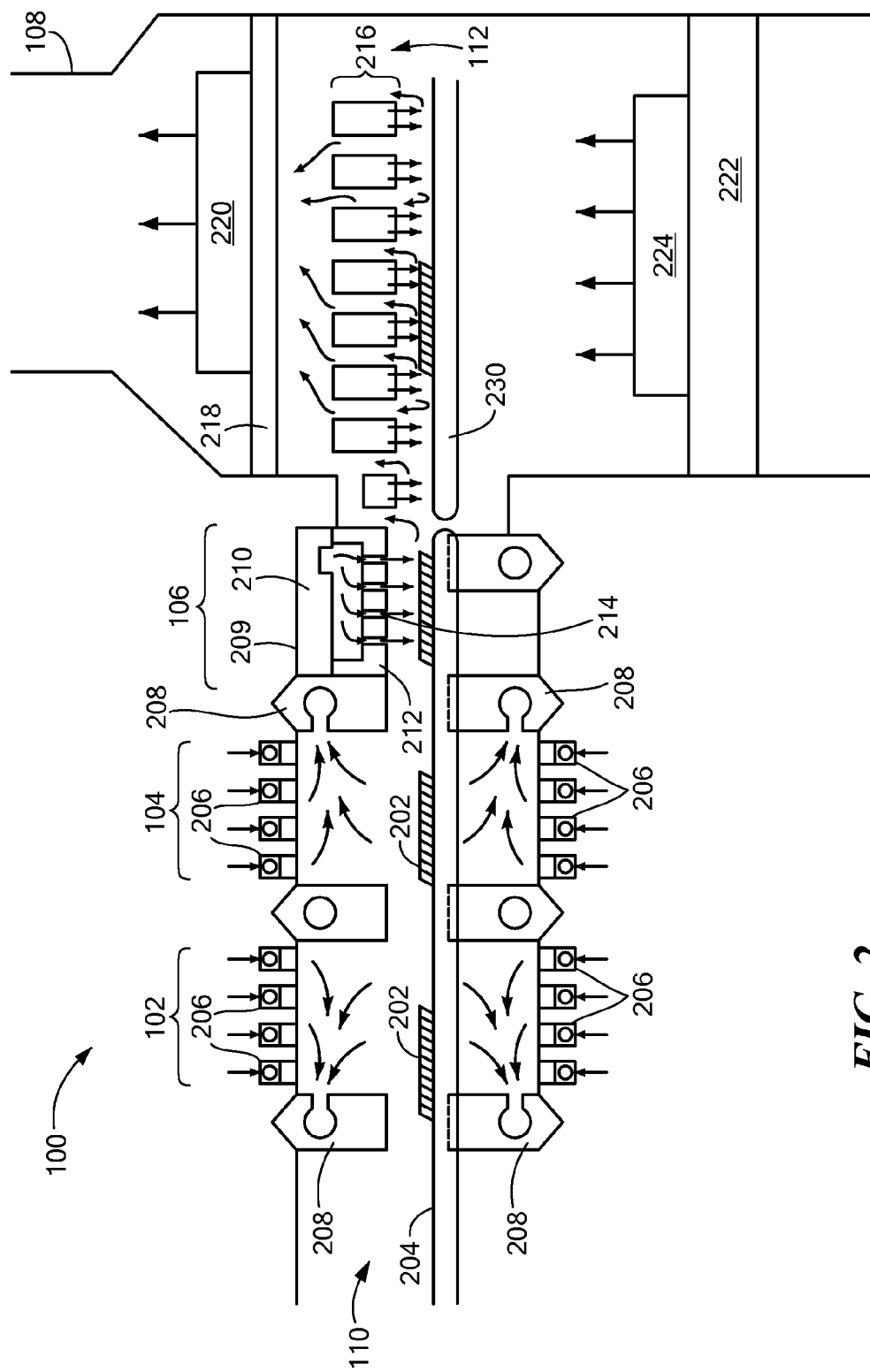
FIG. 2 is a partial cut-away view of the infrared furnace of FIG. 1.

Referring now to FIG. 2, a cut-away view of the furnace 100 is shown. In operation, a workpiece 202, i.e., an object or product to be processed, such as, for example, a solar cell wafer, is provided to the entrance 110 of the dryer section 102 and conveyed, by a conveyor belt 204 that defines a hearth line, under one or more heaters which, in the present embodiment, are electrical coil heaters having a glass ceramic cover. The heaters are disposed along the length of the dryer section 102 above and below the conveyor belt to heat both the top and bottom of the workpiece 202.

At the end of the dryer section 102, the workpiece 202 is transferred to the burnout/firing section 104, sometimes referred to as the "firing process" section. The burnout/firing section 104 includes an array of infrared heating lamps 206 provided in each of an upper and lower section for heating the workpieces 202 being conveyed through the burnout/firing section 104. Although shown with only one zone, the burnout/firing section 104 may have multiple zones thereby providing different zones having different temperatures that can provide the workpiece 202 with a temperature profile in accordance with the desired process.

When the workpiece 202 has reached the end of the burnout/firing section 104 it is conveyed to the cooling system 106. The temperature of the workpiece 202 is quickly lowered to about 600° C. in the cooling section 106. The cooling section 106 includes an air plenum 209 as will be discussed below. Advantageously, the workpiece 202 is quickly cooled down as it passes underneath the air plenum 209.

The HPC cooler 108 includes a ladder plenum 216 that directs high velocity cooling air downward toward the workpiece 202 as it passes through this section on a conveyor belt 230. The downward-directed air is for both impingement to cool and to provide a hold-down force while lower velocity air flows up through the conveyor belt 230. An upper air plenum 218 collects the air and directs it to an upper heat exchanger 220 to further remove the heat from the air. The heat exchanger 220 operates to remove heat from the furnace directly out to either ambient air in the room or through an HVAC system. A lower air plenum 222 provides air to a lower heat exchanger 224 in order to provide uniform cooling air, at a high volume but low velocity, to cool the belt running through the HPC cooler 108. The ladder plenum 216 provides evenly distributed air downward onto the workpiece 202.

A plurality of exhaust piers 208 are provided between the burnout/firing section 104 and the cooling section 106 in order to prevent the cooling gas or air that is directed downward onto the workpiece 202 by the air plenum 209 from interfering with the process gas in the burnout/firing section 104.

Figure 3:
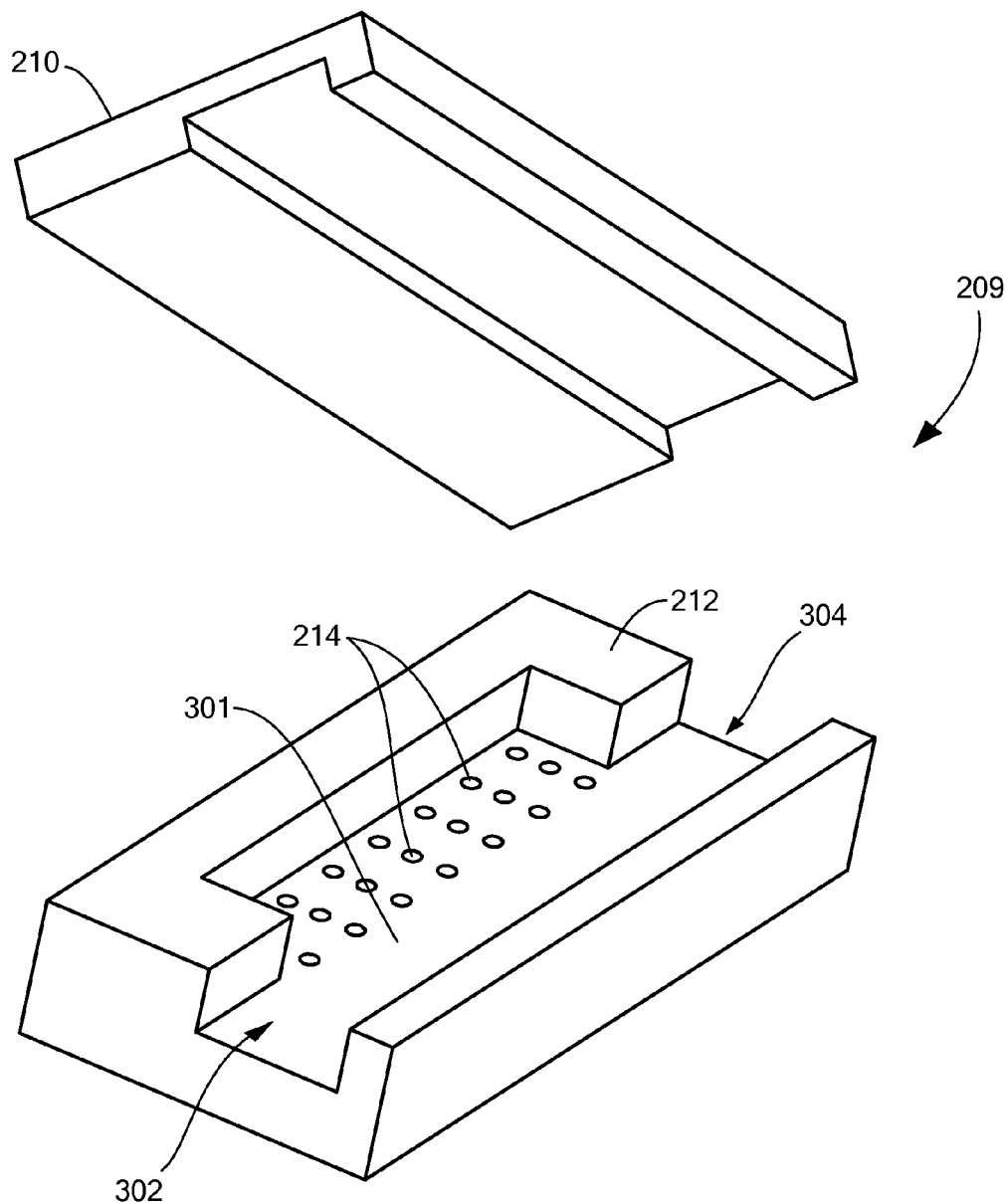
FIG. 3 is an exploded view of a case integrated cooling manifold in accordance with an embodiment of the present invention.

Referring now to FIG. 3, the air plenum 209 includes an upper air plenum portion 210 and a lower air plenum portion 212. Together, the upper and lower plenum portions 210, 212 create a cavity 301 for air to be introduced through openings 302, 304 that is then directed down through a plurality of jet holes 214 onto the workpiece 202. The upper and lower portions 210, 212 are made from the same material as the rest of the case, for example, insulative bricking, in order to allow the air plenum 209 to handle the high temperatures associated with being adjacent to the burnout/firing section 104. Alternatively, only one opening 302 may be provided for introducing air into the cavity 301.

Figure 4A:
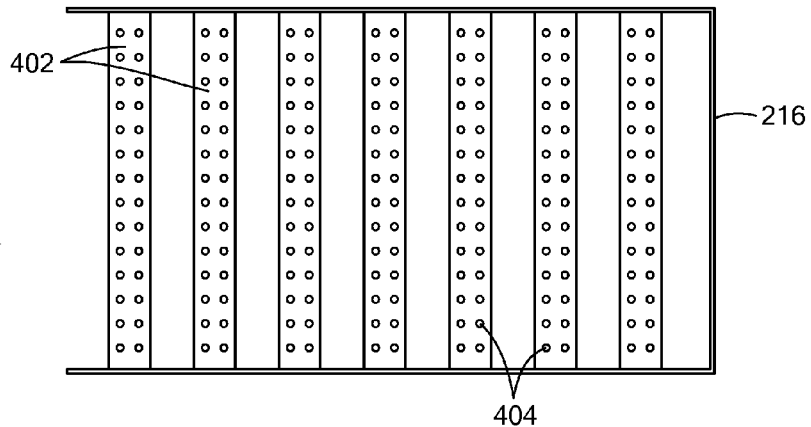
FIGS. 4A-4C present an exploded view of a ladder plenum in accordance with an embodiment of the present invention.
Figure 4B:
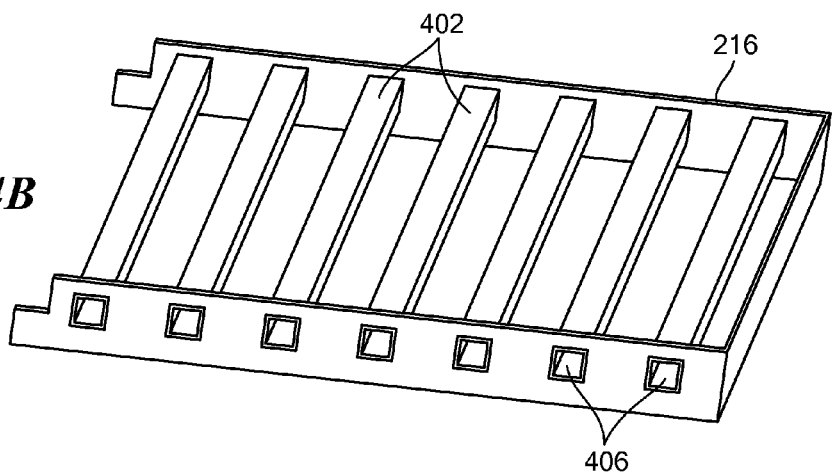
Figure 4C:
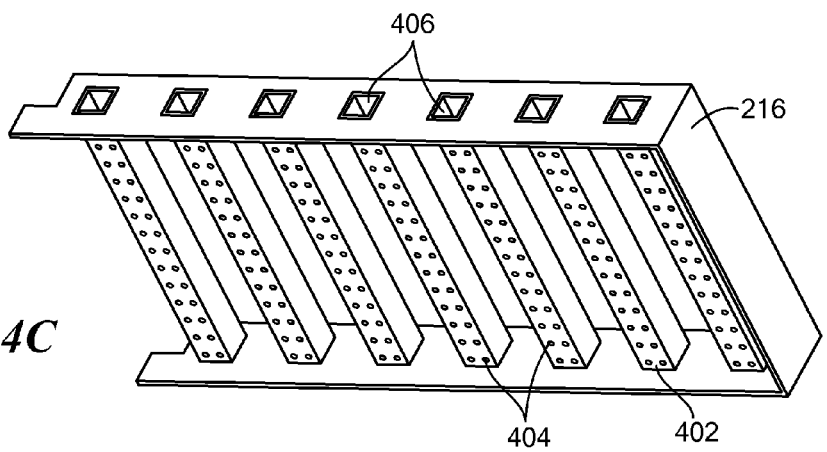

As shown in FIGS. 4A-4C, the ladder plenum 216 includes a plurality of plenum rungs 402 each of which includes a plurality of rung jets 404 for directing air downward toward the workpiece 202. Each of the rungs 402 has at least one inlet 406 through which air is provided in order to be directed through the rung jets 404 downward toward the workpiece 202. One or more blowers push air through ducts (not shown) that are fluidly coupled to each side of the ladder plenum 216 to provide air through the inlets 406. The plenum rungs 402 are spaced apart from one another in order to allow for returning air, for example, air that has been reflected off of the warm workpiece 202, to pass upward through the rungs 402 toward the upper air plenum 218 and the upper heat exchanger 220. The spaces between the plenum rungs 402 allow for unrestricted low velocity flow. This open ladder construction minimizes eddies that can cause movement of the workpiece 202 on the conveyor belt 230.

Figure 5A:
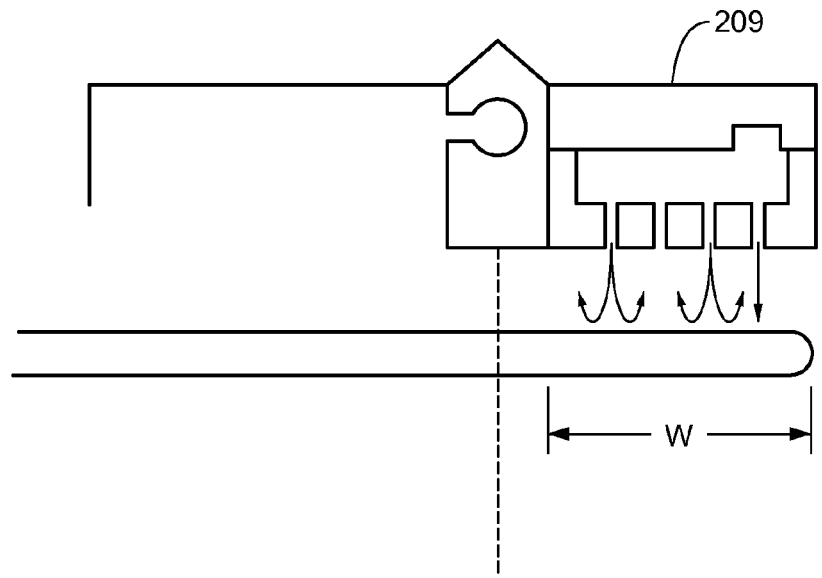
FIG. 5A is a schematic side view of the case integrated cooling manifold.
Figure 5B:
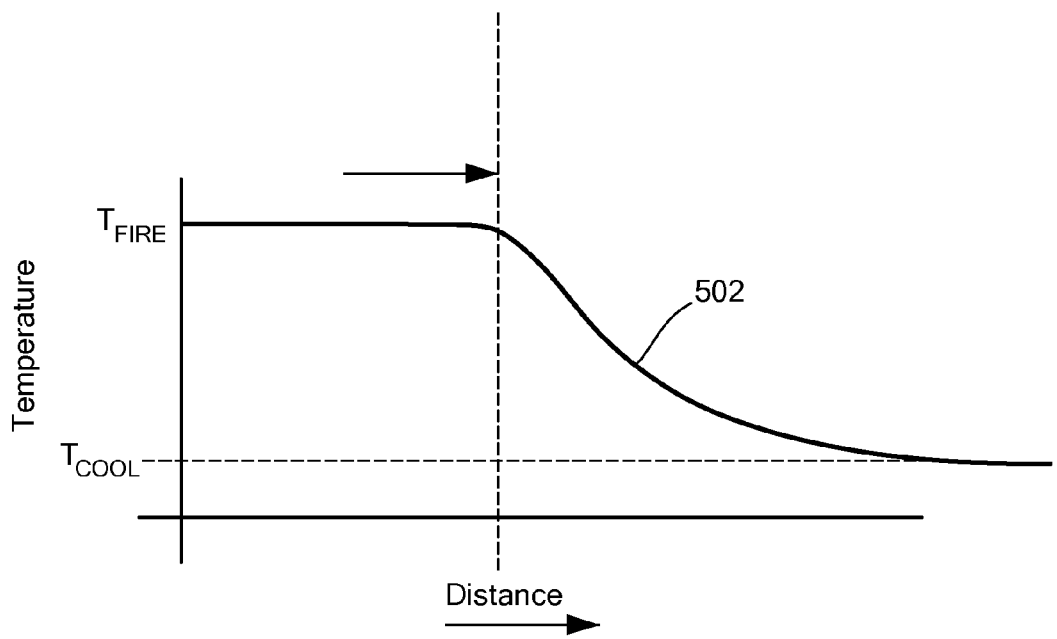
FIG. 5B represents a cooling profile of the case integrated cooling manifold.

Referring now to FIGS. 5A and 5B, a graph 502 represents the temperature of the workpiece 202 as it drops from its firing temperature $T_{FIRE}$ down to a desired cooling temperature $T_{COOL}$ very quickly as it passes under the air plenum 209. In one embodiment of the present invention, the air plenum 209 has a width (W) of 126 millimeters. Advantageously, the workpiece does not dwell at its firing temperature $T_{FIRE}$ any longer than necessary prior to it being transferred to the HPC cooler section 108.

It should be noted that embodiments of the present invention are not limited to a firing furnace for processing wafers but may be implemented in other types of furnaces for processing other types of products.

Certain features of the invention, which, for clarity, have been described in the context of separate embodiments, may also be provided in combination in a single embodiment. Conversely, various features of the invention, which are, for brevity, described in the context of a single embodiment, may also be provided separately or in any suitable sub-combination.

It is to be appreciated that various embodiments of the methods and apparatuses discussed herein are not limited in application to the details of construction and arrangement of components or steps set forth in the following description or illustrated in the accompanying drawings. The method and apparatus are capable of implementation by other embodiments that are being practiced or being carried out in various ways. Examples of specific implementations or embodiments are provided herein for illustrative purposes only and are not intended to be limiting. Particular acts, elements and features discussed in connection with any one of the embodiments are not intended to be excluded from a similar role in any other embodiments. Also, the phraseology and terminology used herein are for the purposes of description and should not be regarded as limiting. The use herein of "including," "comprising," "having," "containing," "involving," and variations thereof, is meant to encompass the items listed thereafter and equivalents thereof, as well as additional items.

Having thus described several features of at least one embodiment of the present invention, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:
1. An infrared (IR) firing furnace comprising:
a furnace case having at least one heating section and an adjacent cooling section, the furnace case comprised of an insulating brick material;

a cooling system within the cooling section of the furnace case, wherein the cooling system comprises a cooling manifold integrated into and made from a same insulating brick material as the furnace case, the cooling manifold comprises an air plenum having upper and lower portions comprised of the same insulating brick material, the upper and lower portions enclosing a cavity, at least one opening in a side of the plenum to introduce cooling air into the cavity, a plurality of jet holes in the lower portion of the plenum to direct cooling air to impinge on a workpiece on a hearth plane extending through the furnace case; and a convection cooling system positioned adjacent to the cooling section to receive the workpiece, the convection cooling section configured to provide cooling air to the workpiece.

2. The IR firing furnace of claim 1, wherein an axis of each of the jet holes is substantially perpendicular to the hearth plane.

3. The IR firing furnace of claim 1, wherein the plurality of jet holes are arranged across a portion of a width of the hearth plane.

4. The IR firing furnace of claim 1, wherein the plurality of jet holes are linearly arranged.

5. The IR firing furnace of claim 1, wherein the hearth plane is defined by a conveyor belt running longitudinally through the furnace case.

6. The IR firing furnace of claim 1, wherein the convection cooling section comprises:
   a conveyor belt on which the workpiece is arranged; and
   a ladder plenum disposed above the conveyor belt and configured to provide cooling air directed downward to a top surface of the workpiece.

7. The IR firing furnace of claim 6, wherein the convection cooling section further comprises:
   a lower air plenum disposed below the conveyor belt and configured to provide cooling air to a bottom portion of the conveyor belt, wherein a velocity of the air from the ladder plenum is greater than a velocity of the air from the lower air plenum.

8. An infrared (IR) firing furnace of comprising:
   a furnace case having at least one heating section and an adjacent cooling section;
   a cooling system within the cooling section of the furnace case, wherein the cooling section is integrated into and made from a same material as the furnace case; and
   a convection cooling section positioned adjacent to the cooling section to receive a workpiece therefrom, wherein the convection cooling section is configured to provide cooling air from above and below the workpiece, the convection cooling section comprising:
      a conveyor belt on which the workpiece is arranged, the conveyor belt comprising a mesh material,
      a ladder plenum disposed above the conveyor belt and configured to provide cooling air directed downward to a top surface of the workpiece, and
      a lower air plenum disposed below the conveyor belt and configured to provide cooling air to a bottom portion of the conveyor belt,
      wherein the velocity of the air from the ladder plenum is greater than the velocity of the air from the lower air plenum such that the workpiece is not lifted up from the conveyor belt.

9. An infrared (IR) firing furnace comprising:
   a furnace case having at least one heating section and an adjacent cooling section;
   a cooling system within the cooling section of the furnace case, wherein the cooling system is integrated into and made from a same material as the furnace case;
   a convection cooling section positioned adjacent to the cooling section to receive a workpiece therefrom, the convection cooling section configured to provide cooling air from above and below the workpiece, the cooling section comprising:
      a conveyor belt on which the workpiece is arranged, and
      a ladder plenum disposed above the conveyor belt and configured to provide cooling air directed downward to a top surface of the workpiece, wherein the ladder plenum comprises a plurality of plenum rungs, each of which comprises a plurality of rung jets for directing the cooling air toward the top surface of the workpiece.

10. The IR firing furnace of claim 9, wherein each rung jet comprises a plurality of holes in fluid connection with an inner portion of the corresponding plenum rung.

11. The IR firing furnace of claim 9, wherein the plenum rungs are spaced apart from one another to allow returning air to pass through.

12. The IR firing furnace of claim 11, wherein the spacing between adjacent plenum rungs is large enough to prevent eddy air currents that might cause movement of the workpiece upon the conveyor belt.

* * * * *